(12) United States Patent
Iwahori et al.

(10) Patent No.: US 9,947,506 B2
(45) Date of Patent: Apr. 17, 2018

(54) SAMPLE HOLDER AND FOCUSED ION BEAM APPARATUS

(71) Applicant: HITACHI HIGH-TECH SCIENCE CORPORATION, Minato-ku, Tokyo (JP)

(72) Inventors: Toshiyuki Iwahori, Tokyo (JP); Tsuyoshi Oonishi, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/467,126

(22) Filed: Mar. 23, 2017

(65) Prior Publication Data
US 2017/0278667 A1    Sep. 28, 2017

(30) Foreign Application Priority Data

Mar. 28, 2016  (JP) ................................. 2016-064337

(51) Int. Cl.
  *H01J 37/00*  (2006.01)
  *H01J 37/20*  (2006.01)
  *H01J 37/26*  (2006.01)

(52) U.S. Cl.
  CPC .............. *H01J 37/20* (2013.01); *H01J 37/26* (2013.01); *H01J 2237/08* (2013.01); *H01J 2237/206* (2013.01); *H01J 2237/31745* (2013.01); *H01J 2237/31749* (2013.01)

(58) Field of Classification Search
  CPC ........ H01J 37/20; H01J 37/26; H01J 2237/08; H01J 2237/206; H01J 2237/31745; H01J 2237/31749
  USPC .......................... 250/306, 307, 308, 310, 311
  See application file for complete search history.

(56) References Cited

U.S. PATENT DOCUMENTS

| | | | |
|---|---|---|---|
| 6,495,838 B1 | 12/2002 | Yaguchi et al. | ........... 250/443.1 |
| 2004/0251413 A1 | 12/2004 | Suzuki et al. | ................ 250/309 |
| 2016/0071687 A1 | 3/2016 | Tsuchiya et al. | |

FOREIGN PATENT DOCUMENTS

| | | |
|---|---|---|
| JP | 2007115666 | 5/2007 |
| JP | 2008270073 | 11/2008 |
| JP | 4297736 | 4/2009 |

OTHER PUBLICATIONS

European Search Report dated Sep. 1, 2017 in Application No. EP 17 16 3154.

*Primary Examiner* — Nicole Ippolito
*Assistant Examiner* — Hanway Chang
(74) *Attorney, Agent, or Firm* — Bruce L. Adams

(57) ABSTRACT

Shaft members which respectively protrude toward at least one beam member and the other beam member in a z-axis direction are formed in a mesh support member. A through hole for penetrating a space between a shaft end surface and an opening portion in the z-axis direction and introducing a focused ion beam toward a fine sample piece is formed in at least one shaft member.

8 Claims, 4 Drawing Sheets

SAMPLE HOLDER AND FOCUSED ION BEAM APPARATUS

This application claims priority from Japanese Patent Application No. 2016-064337 filed on Mar. 28, 2016, the entire subject-matter of which is incorporated herein by reference.

TECHNICAL FIELD

The present disclosure relates to a side-entry type sample holder which is formed to be insertable and removable to and from a focused ion beam apparatus, and can hold a fine sample piece on a tip end side, and relates to a focused ion beam apparatus including the sample holder.

BACKGROUND ART

For example, as one method of analyzing an internal structure of a sample such as a semiconductor device, or of performing three-dimensional observation, a section processing and observing method is known (for example, see JP-A-2008-270073). In the section processing and observing method, section forming processing is performed by a focused ion beam (FIB) and observation of the section obtained by the forming processing is performed by a scanning electron microscope (SEM) by using a charged particle beam combined device. In the charged particle beam combined device, a focused ion beam (FIB) column and an electron beam (EB) column are mounted.

As the section processing and observing method, there has been known a method in which section forming processing by a FIB and section observation by a SEM are repeated so as to form a three-dimensional image. In this method, it is possible to analyze a three-dimensional shape of a target sample in various directions in detail, from the reformed three-dimensional stereoscopic images. Further, this method has an advantage of being possible to reproduce a certain sectional image of a target sample, which is not provided in other methods.

In the meantime, the principle, in the SEM, there is a limit in observation at high magnification (high resolution), and obtained information is also limited to the vicinity of the surface of the sample. Thus, in order to perform observation having high resolution at higher magnification, an observation method using a transmission electron microscopy (TEM) is also known. In the TEM, electrons are transmitted through a sample processed to have a thin film shape. Section forming processing by an FIB as described above is also effective in manufacturing a fine sample (which may be referred to as a fine sample piece below) which is used for observation by such a TEM, and is formed to have a thin film shape.

However, generally, the TEM is required to have a voltage and vacuum higher than that in the SEM. Thus, a size of a TEM device itself is larger than that of an SEM device, and it is difficult to provide a device, in which the TEM device is integrated with an FIB device. Thus, in a case where a fine sample piece obtained by section forming processing with the FIB is used as an observation sample for the TEM, there have been known a configuration in which a sample can be easily moved between the FIB device and the TEM device by using a sample holder that can be commonly used in the FIB device and the TEM device (for example, see Japanese Patent No. 4297736).

For example, JP-A-2007-115666 discloses a sample holder capable of rotating (inclining) in a direction of 90 degrees against a longitudinal direction, by using a crank mechanism. The sample holder has a configuration in which a structure for a rotation axis is not provided, and the portion where the rotation axis is not provided is formed to have a notch structure, and thus it is possible to emit the FIB from both of a vertical direction and a transverse direction that is orthogonal to the vertical direction.

However, in the above-described related-art sample holder disclosed in JP-A-2007-115666, a crank mechanism is formed at a tip end portion thereof. Thus, there is a problem in that configuring a micromotion device, such as of a focused ion beam device, at a tip end side is difficult, and the sample holder can be applied only to a cantilever structure of supporting a sample holder on a single side. The crank mechanism has a problem in that multiple rotation axes and shaft bearings are required, so that the structure is complex and manufacturing cost is high.

SUMMARY

Illustrative aspects of the present disclosure provide a sample holder that enables irradiation of focused ion beams from at least two directions, which are substantially orthogonal to each other, toward a supported fine sample piece with a simple configuration, and to provide a focused ion beam device including the sample holder.

According to an aspect of an embodiment, there is provided the following sample holder and focused ion beam apparatus.

That is, according to the present disclosure, there may be provided a sample holder, which is a side-entry type sample holder insertable and removable to and from a sample chamber of a focused ion beam apparatus, and which enables holding of a fine sample piece at a tip end side, the sample holder comprising: a main body portion having a substantially bar shape and extending along an x-axis direction; and a sample holding portion formed at one end portion of the main body portion in the x-axis direction, the sample holding portion comprising: a first beam member and a second beam member, which are disposed to be separated in a z-axis direction orthogonal to an x axis, and which extend in the x-axis direction; a mesh support member, which is disposed between the first beam member and the second beam member, and which has an opening portion enabling support of a mesh member, the mesh member being configured to hold the fine sample piece; shaft members formed in the mesh support member, each of the shaft members respectively protruding toward the first beam member and the second beam member in the z-axis direction; and a through hole formed in the mesh support member and at least one of the shaft members, the through hole penetrating a space between the opening portion and a shaft end surface of the at least one of the shaft members in the z-axis direction for introducing a focused ion beam toward the fine sample piece According to the sample holder of the present disclosure, in thickness processing of a fine sample piece, when a surface orthogonal to a thickness direction of a fine sample piece is irradiated with the FIB, the FIB is incident through the through hole formed in the shaft member and the mesh support member, and thus it is possible to easily emit the FIB in the z-axis direction of the fine sample piece, and thus to easily manufacture a TEM sample of the fine sample piece.

The sample holding portion may further comprise: a spring member configured to bias the mesh support member in one rotation direction around the z axis; and a rotation control member configured to control rotation of the mesh support member at a predetermined position.

The shaft end surface of the one of the shaft members may be provided on an inside of the first beam member, and a hole portion for exposing the shaft end surface to an outside may be formed in at least one of the first beam member and the second beam member.

An opening diameter of the through hole may be gradually increased from the opening portion to the shaft end surface of the one shaft member.

An engagement protrusion may be formed on a tip end side of the sample holding portion, the engagement protrusion being for rotating the sample holding portion around the x axis.

According to the present disclosure, there may be provided a focused ion beam apparatus comprising: the sample holder according to any one of the above items; a sample stage on which a sample is placed; a focused ion beam column configured to irradiate the sample with a focused ion beam so as to form a fine sample piece; a sample chamber that accommodates the sample stage and the focused ion beam column; and a sample-piece moving unit configured to move the fine sample piece between the sample stage and the sample holder.

According to the focused ion beam apparatus of the present disclosure, in thickness processing of a fine sample piece, when a surface orthogonal to a thickness direction of a fine sample piece is irradiated with the FIB, the FIB is incident through the through hole formed in the shaft member, and thus it is possible to easily emit the FIB in the z-axis direction of the fine sample piece, and thus to easily reduce the thickness of the fine sample piece.

The focused ion beam apparatus may further comprise: a load lock mechanism provided to the sample chamber, the load lock mechanism being configured to cause the sample holder to be insertable and removable to and from the sample chamber while maintaining airtight in the sample chamber.

The focused ion beam apparatus may further comprise: a transmission electron detector provided to the sample chamber, the transmission electron detector being configured to observe a transmission electron image of the fine sample piece held by the sample holder.

According to the present disclosure, it is possible to provide a sample holder that enables irradiation of focused ion beams from at least two directions which are substantially orthogonal to each other, toward a supported fine sample piece with a simple configuration, and to provide a focused ion beam apparatus including the sample holder.

DETAILED DESCRIPTION

Hereinafter, a sample holder and a focused ion beam apparatus including the sample holder according to an embodiment will be described with reference to the drawings. The following embodiment will be specifically described only for understanding the purpose of the present disclosure better, and is not limited to the present disclosure as long as particular statement is not described. Regarding the drawings used in the following descriptions, in order to easily understand the characteristics of the present disclosure, for convenience, a portion function as the main portion may be illustrated with being enlarged, and a dimension ratio and the like of the components are not limited to being the same as the practical those.

Figure 1:
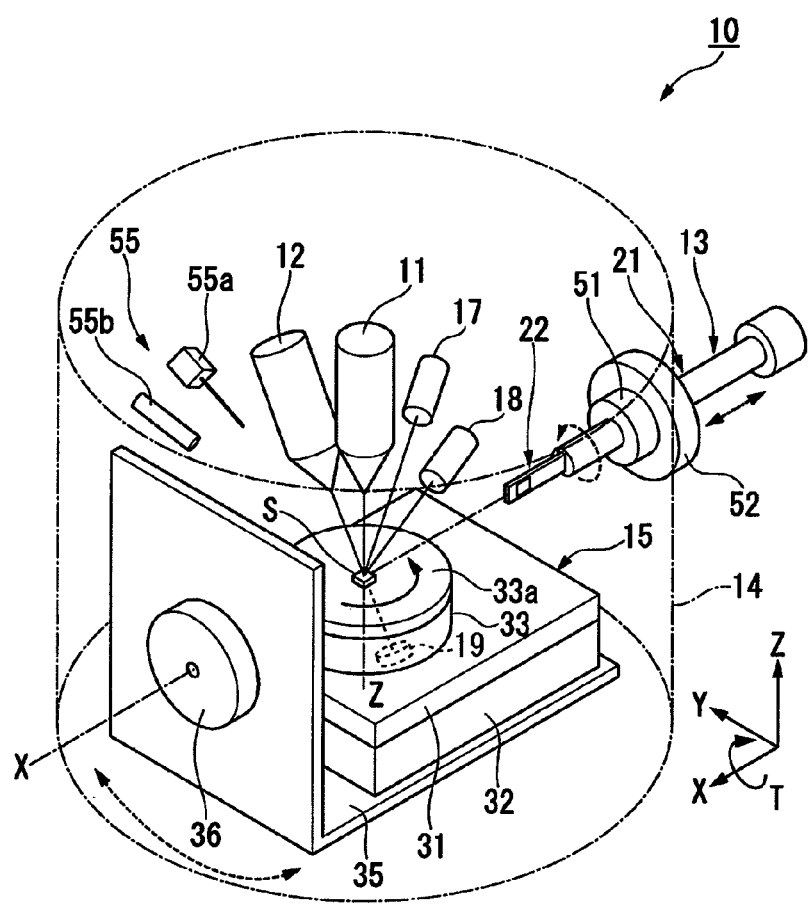
FIG. 1 is a schematic configuration diagram illustrating a focused ion beam apparatus including a sample holder according to an embodiment.

FIG. 1 is a schematic configuration diagram illustrating a focused ion beam apparatus including a sample holder according to an embodiment.

A sample processing and observation device (focused ion beam apparatus) 10 according to the embodiment includes a focused ion beam (FIB) column 11 configured to irradiate a focused ion beam (FIB), an electron beam (EB) column 12 configured to irradiate an electron beam (EB), a sample stage 15 on which a sample S is placed, a sample chamber 14 which accommodates the above components, and a side-entry type sample holder 13 formed to be insertable and removable to and from the sample chamber 14. The focused ion beam column 11 and the electron beam column 12 are respectively fixed to the sample chamber 14.

The sample processing and observation device 10 further includes a secondary electron detector 17, an EDS detector 18 and a transmission electron detector 19. The secondary electron detector 17 detects secondary electrons generated from the sample S in response to the sample S being irradiated with a focused ion beam or an electron beam. The EDS detector 18 detects an X ray generated from the sample S in response to the sample S being irradiated with an electron beam S. The X ray generated from the sample S includes a characteristic X ray unique to a material constituting the sample S. It is possible to specify the material constituting the sample S by using such a characteristic X ray. The transmission electron detector 19 detects transmission electrons transmitted through the sample S in response to the sample S being irradiated with the electron beam so as to form a transmission electron image of the sample S.

A configuration in which a reflected-electron detector is provided instead of the secondary electron detector 17 is also preferable. The reflected-electron detector detects reflected electrons obtained by reflecting an electron beam at the sample S. It is possible to obtain a cross-section image in which mass contrast of a material is applied and the quantity of unevenness information of the cross section is reduced, by using such reflected electrons. The secondary electron detector 17 and the reflected-electron detector can be installed in the housing of a SEM.

A configuration in which an EBSD detector is provided instead of the EDS detector 18 is also preferable. In the EBSD detector, in response to a crystalline material being irradiated with an electron beam, electron-beam backscattering and diffraction occurs on the surface of the sample S, and a diffraction figure, that is, an EBSD pattern is observed, so that information regarding a crystal orientation of the sample S is obtained. By measuring and analyzing such an EBSD pattern, information regarding distribution of a crystal orientation in a fine region of the sample S is obtained, so that the material constituting the sample S can be specified.

The focused ion beam apparatus 10 according to the present disclosure may include at least the focused ion beam (FIB) column 11 and the side-entry type sample holder 13. The focused ion beam apparatus 10 may have a configuration in which only sample processing is performed by using a focused ion beam without particularly providing the electron beam column 12 or the EDS detector 18.

The sample chamber 14 is configured from a pressure-resistant housing having an airtight structure in which an inside can be decompressed. A vacuum pump (not illustrated) configured to decompress the inside thereof is connected to the sample chamber 14.

The sample stage 15 includes a main body portion 31, a moving member 32 configured to move the main body portion 31, and a turntable (table) 33 provided in the main body portion 31. As illustrated in FIG. 1, the moving member 32 can move the main body portion 31 on which the turntable 33 is placed, in an x axis along a horizontal surface, a y axis orthogonal to the x axis, and a z axis along a vertical direction, respectively. A control unit (not illustrated), which controls the entirety of the sample processing and observation device 10, controls such moving control of the moving member 32.

The turntable 33 is formed to have a columnar shape, for example. The turntable 33 can rotate a sample placement surface 33a on which the sample S is placed, around the z axis. The control unit (not illustrated), which controls the entirety of the sample processing and observation device 10, controls such rotation control of the turntable 33.

The sample stage 15 is supported by a sample stage support member 35. The sample stage support member 35 is formed to have a substantially L shape, for example. The sample stage support member 35 is engaged with a tilt member 36 formed on a side wall of the sample chamber 14. As illustrated in FIG. 1, the tilt member 36 rotates the sample stage support member 35 around the x axis along the horizontal surface. Thus, the entirety of the sample stage 15 including the turntable 33 can be swung around the x axis. The turntable 33 is provided to enable swing around the x axis, and thus the sample placement surface 33a can be inclined from the horizontal surface at a certain angle.

A load lock mechanism 51 and a sample holder moving member 52 are formed on the side wall of the sample chamber 14. The load lock mechanism 51 holds the sample holder 13 to be insertable and removable to and from the sample chamber 14 while maintaining the airtight in the sample chamber 14. The sample holder moving member 52 can move the sample holder 13 to a desired FIB processing position.

The load lock mechanism 51 is a shutter for holding the sample chamber 14, for example, in a vacuum state when the sample holder 13 is inserted into the sample chamber 14 from the outside or when the sample holder 13 is extracted from the sample chamber 14 to the outside. Known configurations such as a vacuum shutter may be applied thereto.

The sample holder moving member 52 can move the sample holder 13 inserted into the sample chamber 14, to the desired FIB processing position.

The focused ion beam apparatus 10 includes a deposition gas gun 55b for supplying a deposition gas to the sample S. The focused ion beam apparatus 10 includes sample-piece moving means 55 for moving a fine sample piece between the sample stage 15 and the sample holder 13. The sample-piece moving means 55 is, for example, a device that transfers a fine sample piece which has been obtained by processing the sample S with a focused ion beam and is positioned at the sample stage 15, to a mesh member 41 (see FIG. 3) of the sample holder 13. As such sample-piece moving means 55, for example, known sample-piece moving means such as a probe 55a may be applied.

Figure 2:
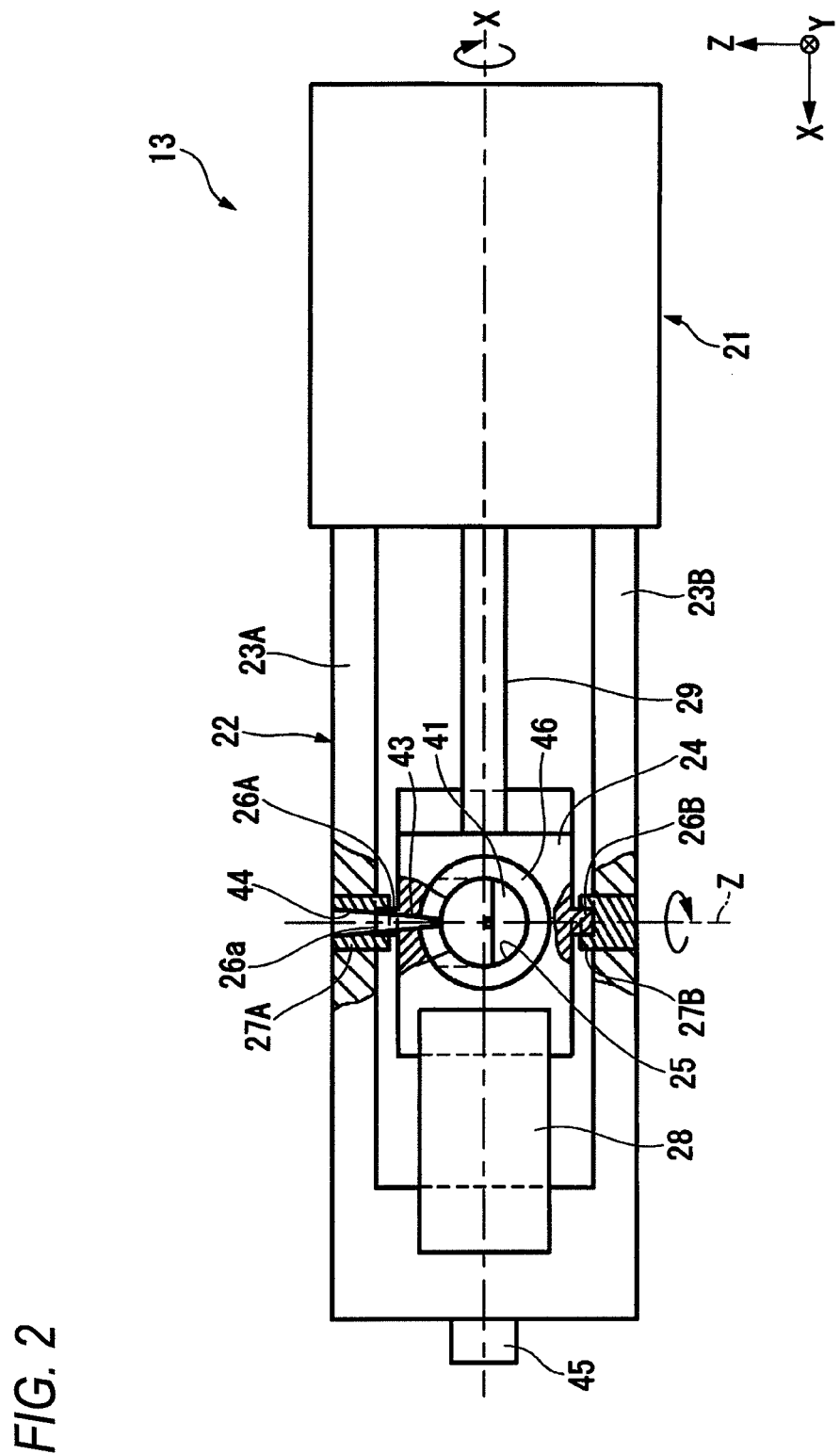
FIG. 2 is a plan view of a fractured main portion illustrating the sample holder.
Figure 3:
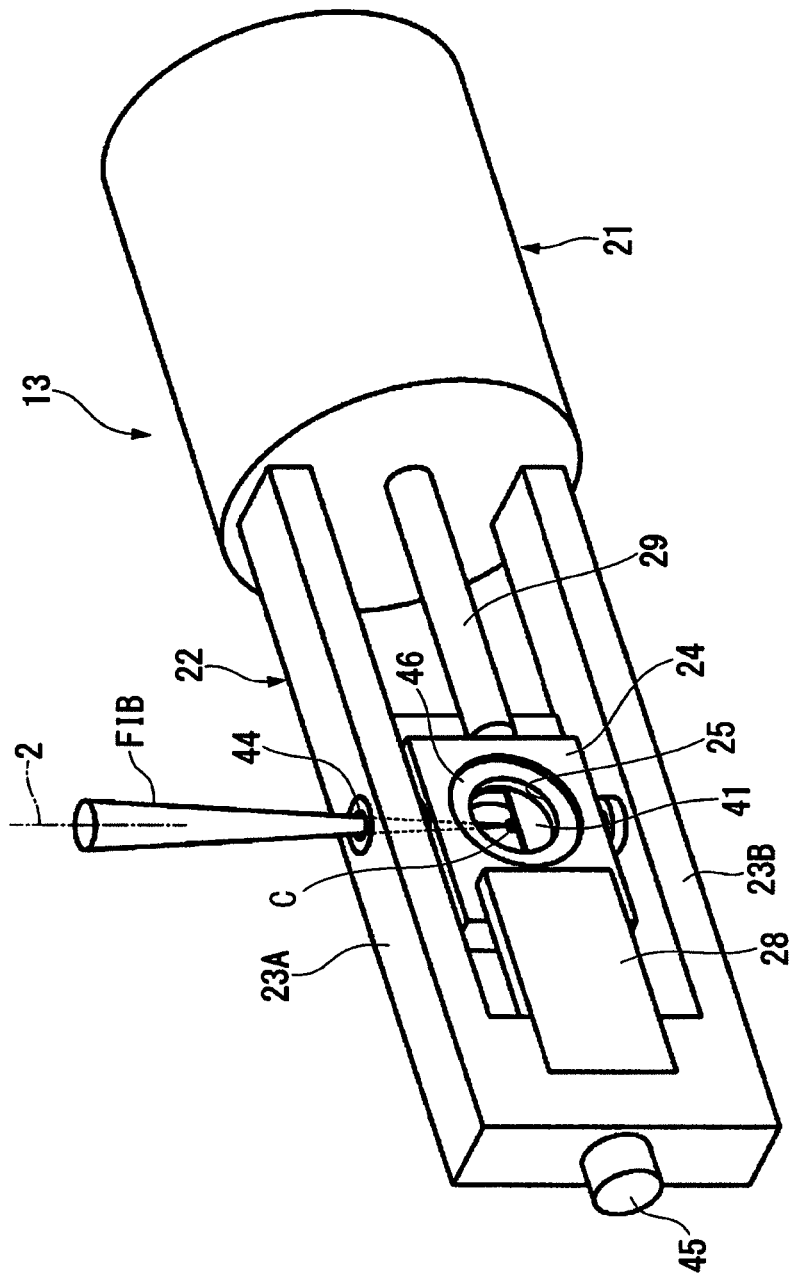
FIG. 3 is a perspective view illustrating a state when a fine sample piece is processed by using the sample holder.
Figure 4:
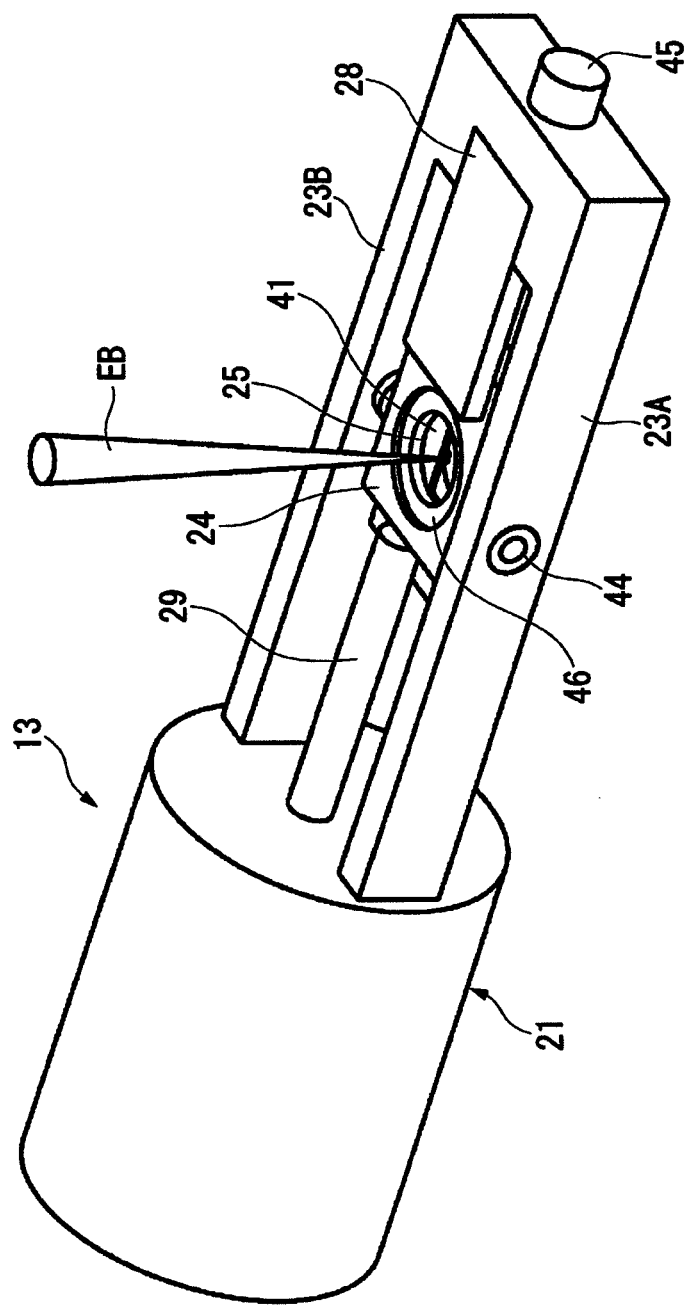
FIG. 4 is a perspective view illustrating a state when the fine sample piece is observed by using the sample holder.

FIG. 2 is a plan view of a fractured main portion illustrating the sample holder. FIG. 3 is a perspective view illustrating a state when the fine sample piece is processed by using the sample holder. FIG. 4 is a perspective view illustrating a state when the fine sample piece is observed by using the sample holder.

The sample holder 13 in the embodiment is a side-entry type sample holder formed to be insertable and removable to and from the sample chamber 14 of the focused ion beam apparatus 10. The sample holder 13 includes a main body portion 21 (see FIG. 1) and a sample holding portion 22. The main body portion 21 has a substantially bar shape and is extended in an x-axis direction that is an insertion direction of the sample holder. The sample holding portion 22 is formed at one end portion of the main body portion 21 in the x-axis direction.

The sample holding portion 22 includes two beam members 23A and 23B and a mesh support member 24. The two beam members 23A and 23B are disposed to be separated from each other in a focused-ion beam irradiation direction, that is, in a z-axis direction orthogonal to the x axis, and are respectively extended in the x-axis direction. The mesh support member 24 is a plate member having a substantially rectangular shape and is disposed to be rotatable around the z axis between the two beam members 23A and 23B. The beam member 23A (one example of a first beam member) and the beam member 23B (one example of a second beam member) are bent at a tip end portion thereof in the z-axis direction, and are connected to each other. When being viewed from a y-axis direction, the entirety of the beam member 23A and the beam member 23B is formed to have a substantially U shape. An engagement protrusion 45 is formed on the tip end side of the sample holding portion 22. The engagement protrusion 45 causes the sample holding portion 22 to be rotatable in the T direction that is a rotation direction around the x axis. Such an engagement protrusion 45 engages with an acceptance member (not illustrated) formed at one end of the sample stage 15 of the focused ion beam apparatus 10, so as to be rotatable, and thus can cause the sample holding portion 22 to be rotatable in the T direction.

An opening portion 25 having a substantially circular shape is formed at the center portion of the mesh support member 24. A mesh member 41 that holds the fine sample piece C is formed in the opening portion 25 along the z-axis direction.

The mesh member 41 is, for example, a net-like member for placing a fine sample piece which is obtained by processing the sample S with a focused ion beam and is used for TEM analysis. As such a mesh member 41, for example, an object obtained in a manner that a metal plate processed to have a circular shape or a fine pillar manufactured by a silicon process is fixed to a thin plate is used. Such a mesh member 41 may be supported to the opening portion 25 by a fixing member 46 disposed at a circumference of the opening portion 25.

Shaft members 26A and 26B are configured in the mesh support member 24 as an integrated member or separated members. The shaft members 26A and 26B have a substantially columnar shape and protrude toward the one beam member 23A and the other beam member 23B, in the z-axis direction.

A shaft bearing portion 27A that supports the shaft member 26A to be rotatable is formed in the one beam member 23A. A shaft bearing portion 27B that supports the shaft member 26B to be rotatable is formed in the other beam member 23B. The shaft members 26A and 26B, and the shaft bearing portions 27A and 27B are engaged to be rotatable in this manner, and thus the mesh support member 24 is supported between the beam member 23A and the beam member 23B, so as to be rotatable around the z axis.

A spring member 28 and a rotation control member 29 are formed in the sample holding portion 22. The spring member 28 biases the mesh support member 24 in one rotation direction around the z axis. The rotation control member 29 controls the rotation of the mesh support member 24 at a predetermined position. The mesh support member 24 comes into contact with one end of the spring member 28 so as to be biased in a clockwise direction with the z axis in FIG. 2 as the center. The rotation control member 29 comes into contact with the one end of the mesh support member 24, and controls rotation of the mesh support member 24 so as to cause the main surface of the mesh member 41 to stay at a position along the x axis and the y axis. Thus, the mesh support member 24 causes the main surface of the mesh member 41 to be rotatable from the position along the x axis and the y axis to being 90 degrees in a counterclockwise direction with the z axis as the center, against the bias of the spring member 28.

A through hole 43 is formed in at least one shaft member 26A. The through hole 43 penetrates a space between the shaft end surface 26a and the opening portion 25 of the mesh support member 24 in the z-axis direction. A shaft end surface 26a of the shaft member 26A is positioned in the one beam member 23A. A hole portion 44 configured to expose the shaft end surface 26a of the shaft member 26 to the outside thereof is formed in at least the one beam member 23A.

The through hole 43 and the hole portion 44, which are formed in the shaft member 26A and in the beam member 23A, respectively, form a passage route of the FIB that is penetrated from the outer surface of the beam member 23A to the opening portion 25 of the mesh support member 24 along the z-axis direction. Thus, the FIB emitted from the focused ion beam column 11 (see FIG. 1) can pass through the hole portion 44 and the through hole 43 and can be incident toward a thickness surface of a fine sample piece C supported by the mesh member 41.

The through hole 43 is formed to have a funnel shape or a step shape, so as to have an opening diameter which is gradually increased from the opening portion 25 toward the shaft end surface 26a of the one shaft member 26A. The hole portion 44 of the beam member 23A, which is linked to the through hole 43, is also formed to have a funnel shape or a step shape, so as to have an opening diameter which is gradually increased from the shaft end surface 26a of the shaft member 26A toward the outside of the beam member 23A. Thus, it is possible to prevent the FIB, which is emitted toward the fine sample piece C to be focused thereon, from contacting an inner circumferential surface of the hole portion 44 and the through hole 43.

Advantages of the sample holder 13 having the above-described configuration the focused ion beam apparatus 10 including the sample holder 13 will be described.

When, for example, a fine sample piece for TEM observation is formed from a sample (bulk) S by the sample processing and observation device (focused ion beam apparatus) 10 in the embodiment, in advance, the sample holder 13 is retracted from the inside of the sample chamber 14.

A SEM image is confirmed and moves to a position at which it is assumed that an observation target of the sample S is included. Then, a fine arm portion is left from an outside and the bottom of an area in which the observation target is included, and is processed with a focused ion beam (FIB). A tip end of a probe 55a of a manipulator is brought into contact with the fine sample piece, and the contact portion is irradiated with the FIB while a gas is supplied by the deposition gas gun 55b. Thus, a deposition film is formed and fixed. Then, the above-described fine arm portion is cut off by the FIB, and thus is separated into a fine sample piece and a sample (bulk) S.

As described above, the probe 55a of the manipulator is moved to a retraction position, in a state where the fine sample piece including the observation target is separated from the sample S by the FIB. Then, the sample holder 13 is inserted into the sample chamber 14 through the load lock mechanism 51.

If the sample holder 13 is inserted into the sample chamber 14, the fine sample piece held by the probe 55a at the retraction position is moved to the vicinity of the mesh member 41 of the sample holder 13, by using the sample-piece moving means 55. At this time, the position of the mesh member 41 is moved to a beam coincidence point between the FIB and the SEM, in advance. Then, the probe 55a is driven to be brought into contact with a sample fixation position of the mesh member 41 while the position of the fine sample piece is adjusted. Thus, the probe 55a and the sample piece are fixed by using the deposition film. Then, the probe 55a and the fine sample piece are separated from each other by FIB processing. After the separation, the probe is retracted.

Then, the fine sample piece fixed to the mesh member 41 is subjected to thin film processing while an angle between the FIB and the fine sample piece is adjusted. The fine sample piece is processed to be as thin as TEM observation is possible. In the thickness processing of the fine sample piece in this manner, when the surface orthogonal to the thickness direction of the fine sample piece is irradiated with the FIB, the FIB is incident through the through hole 43 formed in the shaft member 26A and the hole portion 44 formed in the beam member 23A. Thus, it is possible to easily emit the FIB in the z-axis direction in FIG. 2, and thus to reduce the thickness of the fine sample piece to have a thickness most appropriate for TEM observation.

The engagement protrusion 45 that causes the sample holding portion 22 to be rotatable in the T direction is formed in the sample holder 13. Thus, if the engagement protrusion 45 is engaged with the acceptance portion (not illustrated) formed at the one end of the sample stage 15 of the focused ion beam apparatus 10, it is possible to easily rotate the sample holding portion 22 in the T direction. With such a configuration, it is possible to ensure compatibility between a so-called cantilever stage at which the sample holder 13 is held only on one end side, and a non-cantilever stage at which the sample holder 13 is held only on both sides, and to realize a FIB-TEM shared sample holder with a simple configuration. Then by irradiating the fine sample piece, which thickness has been reduced, with the electron beam and by detecting the transmission electrons transmitted through the fine sample piece by the transmission electron detector 17, it becomes possible to observe the transmission electron image of the fine sample piece held by the sample holder 13.

The embodiment of the present disclosure is described. However, the embodiment is just an example, and is not intended to be limited to the scope of the disclosure. The embodiment may be conducted in other various forms, and various omissions, replacements, and changes may be performed in a range without departing from the scope of the disclosure. The embodiment and modifications thereof are included in the disclosure described in the scope of the claims, and in an equivalent range, similarly to be included in the scope of the disclosure.

What is claimed is:

1. A sample holder, which is a side-entry type sample holder insertable and removable to and from a sample chamber of a focused ion beam apparatus, and which enables holding of a fine sample piece at a tip end side, the sample holder comprising:
   a main body portion having a substantially bar shape and extending along an x-axis direction; and
   a sample holding portion formed at one end portion of the main body portion in the x-axis direction, the sample holding portion comprising:
      a first beam member and a second beam member, which are disposed to be separated in a z-axis direction orthogonal to an x axis, and which extend in the x-axis direction;
      a mesh support member, which is disposed between the first beam member and the second beam member, and which has an opening portion enabling support of a mesh member, the mesh member being configured to hold the fine sample piece;
      shaft members formed in the mesh support member, each of the shaft members respectively protruding toward the first beam member and the second beam member in the z-axis direction; and
      a through hole formed in the mesh support member and at least one of the shaft members, the through hole penetrating a space between the opening portion and a shaft end surface of the at least one of the shaft members in the z-axis direction for introducing a focused ion beam toward the fine sample piece.

2. The sample holder according to claim 1, wherein the sample holding portion further comprises:
   a spring member configured to bias the mesh support member in one rotation direction around the z axis; and
   a rotation control member configured to control rotation of the mesh support member at a predetermined position.

3. The sample holder according to claim 1,
   wherein the shaft end surface of the one of the shaft members is provided on an inside of the first beam member, and
   wherein a hole portion for exposing the shaft end surface to an outside is formed in at least one of the first beam member and the second beam member.

4. The sample holder according to claim 1, wherein an opening diameter of the through hole is gradually increased from the opening portion to the shaft end surface of the one shaft member.

5. The sample holder according to claim 1, wherein an engagement protrusion is formed on a tip end side of the sample holding portion, the engagement protrusion being for rotating the sample holding portion around the x axis.

6. A focused ion beam apparatus comprising:
   the sample holder according to claim 1;
   a sample stage on which a sample is placed;
   a focused ion beam column configured to irradiate the sample with a focused ion beam so as to form a fine sample piece;
   a sample chamber that accommodates the sample stage and the focused ion beam column; and
   a sample-piece moving unit configured to move the fine sample piece between the sample stage and the sample holder.

7. The focused ion beam apparatus according to claim 6, further comprising:
   a load lock mechanism provided to the sample chamber, the load lock mechanism being configured to cause the sample holder to be insertable and removable to and from the sample chamber while maintaining airtight in the sample chamber.

8. The focused ion beam apparatus according to claim 6, further comprising:
   a transmission electron detector provided to the sample chamber, the transmission electron detector being configured to observe a transmission electron image of the fine sample piece held by the sample holder.

* * * * *